(12) United States Patent
Cruz

(10) Patent No.: US 11,937,387 B2
(45) Date of Patent: Mar. 19, 2024

(54) VEHICLE TRACKING UNIT

(71) Applicant: NISSAN NORTH AMERICA, INC., Franklin, TN (US)

(72) Inventor: Arturo Cruz, Mexico City (MX)

(73) Assignee: Nissan North America, Inc., Franklin, TN (US)

( * ) Notice: Subject to any disclaimer, the term of this patent is extended or adjusted under 35 U.S.C. 154(b) by 44 days.

(21) Appl. No.: 17/390,770

(22) Filed: Jul. 30, 2021

(65) Prior Publication Data

US 2023/0031482 A1 Feb. 2, 2023

(51) Int. Cl.
*H05K 5/02* (2006.01)
*H05K 5/00* (2006.01)

(52) U.S. Cl.
CPC ......... *H05K 5/0208* (2013.01); *H05K 5/0026* (2013.01); *H05K 5/0073* (2013.01); *H05K 5/0247* (2013.01)

(58) Field of Classification Search
CPC .. H05K 5/0026; H05K 5/0073; H05K 5/0208; H05K 5/0247
See application file for complete search history.

(56) References Cited

U.S. PATENT DOCUMENTS

| | | | |
|---|---|---|---|
| 6,581,967 B1 * | 6/2003 | Logan | B62D 25/147 296/72 |
| 6,776,373 B1 * | 8/2004 | Talmage, Jr. | B64D 25/12 244/140 |
| 8,205,944 B2 | 6/2012 | Watanabe | |
| 2003/0071473 A1 * | 4/2003 | Kondo | H01R 25/161 296/34 |
| 2008/0296334 A1 * | 12/2008 | Carnevali | B60R 11/0241 224/558 |
| 2010/0302371 A1 * | 12/2010 | Abrams | G08G 1/0175 348/149 |
| 2011/0155495 A1 * | 6/2011 | Matsuda | B62K 11/04 180/219 |
| 2016/0052540 A1 * | 2/2016 | Lee | B62D 5/0409 180/443 |
| 2016/0152172 A1 * | 6/2016 | Eboli | F16M 13/022 248/230.5 |
| 2017/0217510 A1 * | 8/2017 | Iwata | B62D 49/0692 |
| 2019/0039712 A1 * | 2/2019 | Moore | B64D 27/24 |

FOREIGN PATENT DOCUMENTS

WO 2017125803 A1 7/2017

* cited by examiner

*Primary Examiner* — Jacob R Crum
(74) *Attorney, Agent, or Firm* — Global IP Counselors, LLP

(57) ABSTRACT

A vehicle includes a cockpit module skin, a cross-bar and a vehicle tracking unit. The cockpit module skin separates a passenger compartment into a first area and a second area. The cross-bar is supported to a vehicle body component in the first area. The vehicle tracking unit has an electric tracking module and a mounting bracket supporting the electric tracking module to the cross-bar.

16 Claims, 5 Drawing Sheets

VEHICLE TRACKING UNIT

BACKGROUND

Field of the Invention

The present invention generally relates to a vehicle tracking unit. More specifically, the present invention relates to a vehicle tracking unit that is provided inside a cockpit module of a vehicle.

Background Information

Vehicles can be provided with a vehicle tracking and recovery system that is an electronic device provided in the vehicle interior that tracks a vehicle movement and location of the vehicle. Therefore, a vehicle tracking and recovery system includes a global positioning module that tracks the movement of the vehicle. Typically, vehicle tracking and recovery systems are provided inside a cockpit module of a vehicle. For example, a vehicle tracking recovery system can be attached to a cockpit module cross bar.

SUMMARY

In view of the state of the known technology, one aspect of the present disclosure is to provide a vehicle comprises a cockpit module skin, a cross-bar and a vehicle tracking unit. The cockpit module skin separates a passenger compartment into a first area and a second area. The cross-bar is supported to a vehicle body component in the first area. The vehicle tracking unit has an electric tracking module and a mounting bracket supporting the electric tracking module to the cross-bar.

In view of the state of the known technology, another aspect of the present disclosure is to provide a vehicle tracking unit comprising an electric tracking module and a mounting bracket. The mounting bracket is fixed to the electric tracking module to support the electric tracking module to a vehicle body component of a vehicle. The mounting bracket includes a first panel and a second panel. The first and second panels extending cantilevered with respect to each other.

BRIEF DESCRIPTION OF THE DRAWINGS

Referring now to the attached drawings which form a part of this original disclosure.

DETAILED DESCRIPTION OF EMBODIMENTS

Selected embodiments will now be explained with reference to the drawings. It will be apparent to those skilled in the art from this disclosure that the following descriptions of the embodiments are provided for illustration only and not for the purpose of limiting the invention as defined by the appended claims and their equivalents.

Figure 1:
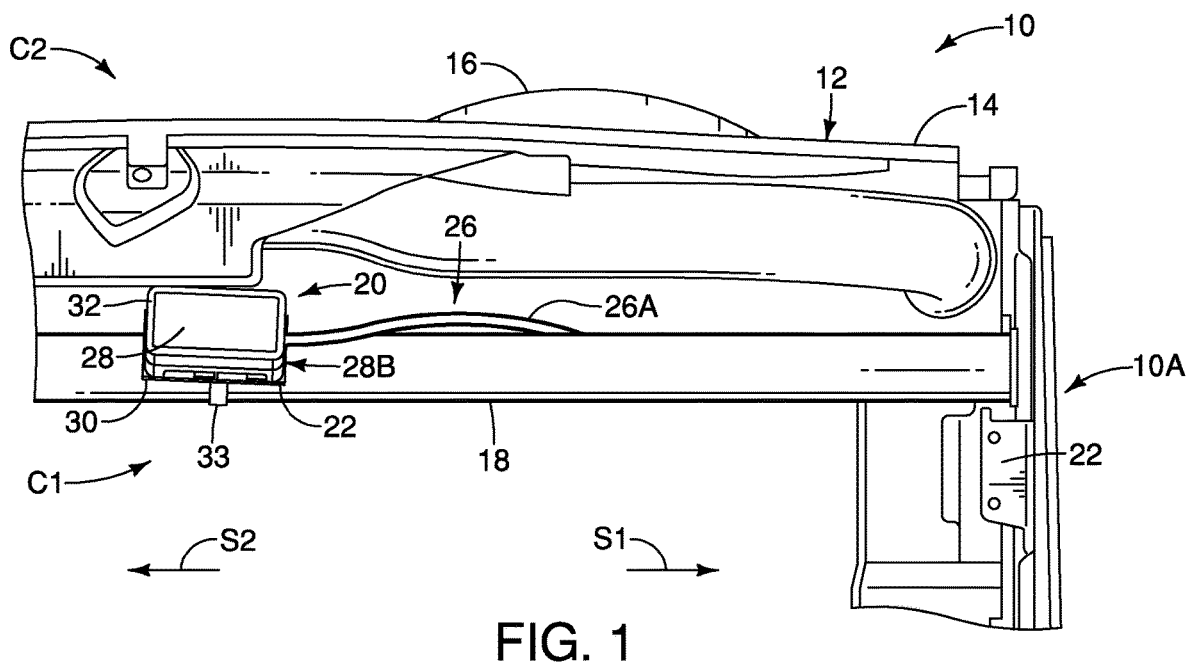
FIG. 1 is a view a cockpit module equipped with a vehicle tracking unit in accordance with an illustrated embodiment.
Figure 2:
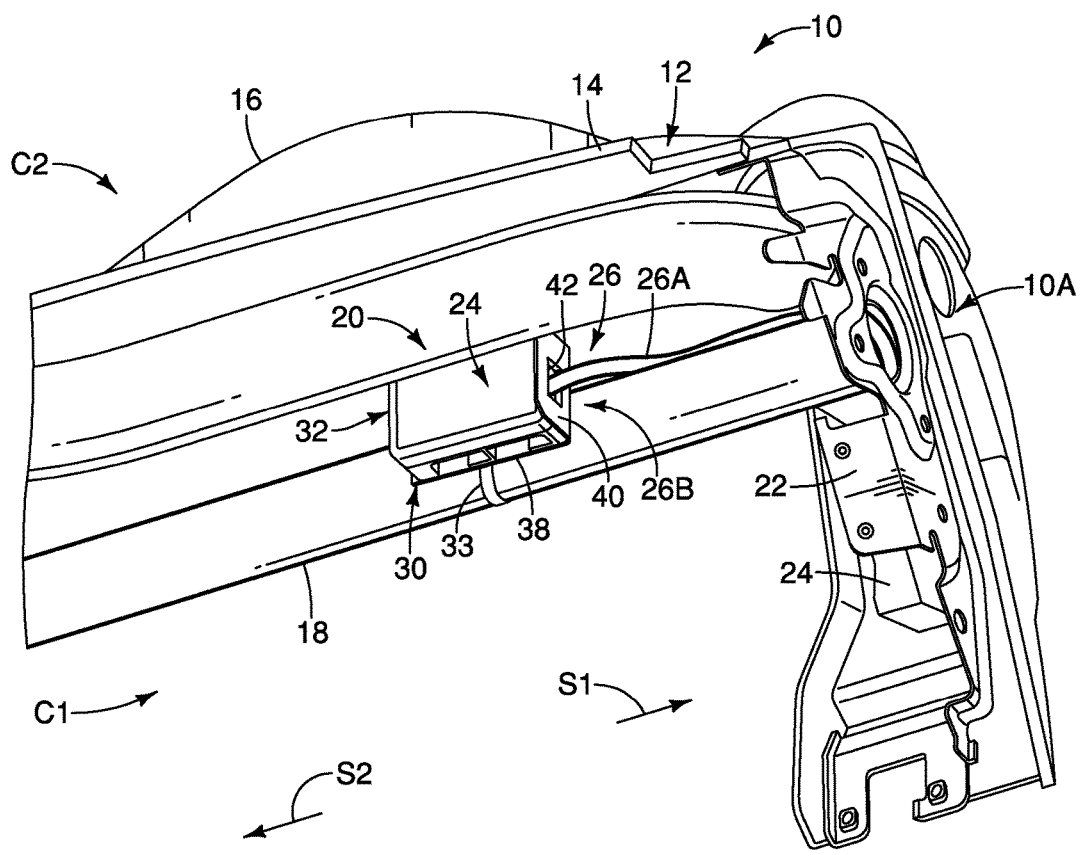
FIG. 2 is another view of the cockpit module equipped with the vehicle tracking unit of FIG. 1.
Figure 3:
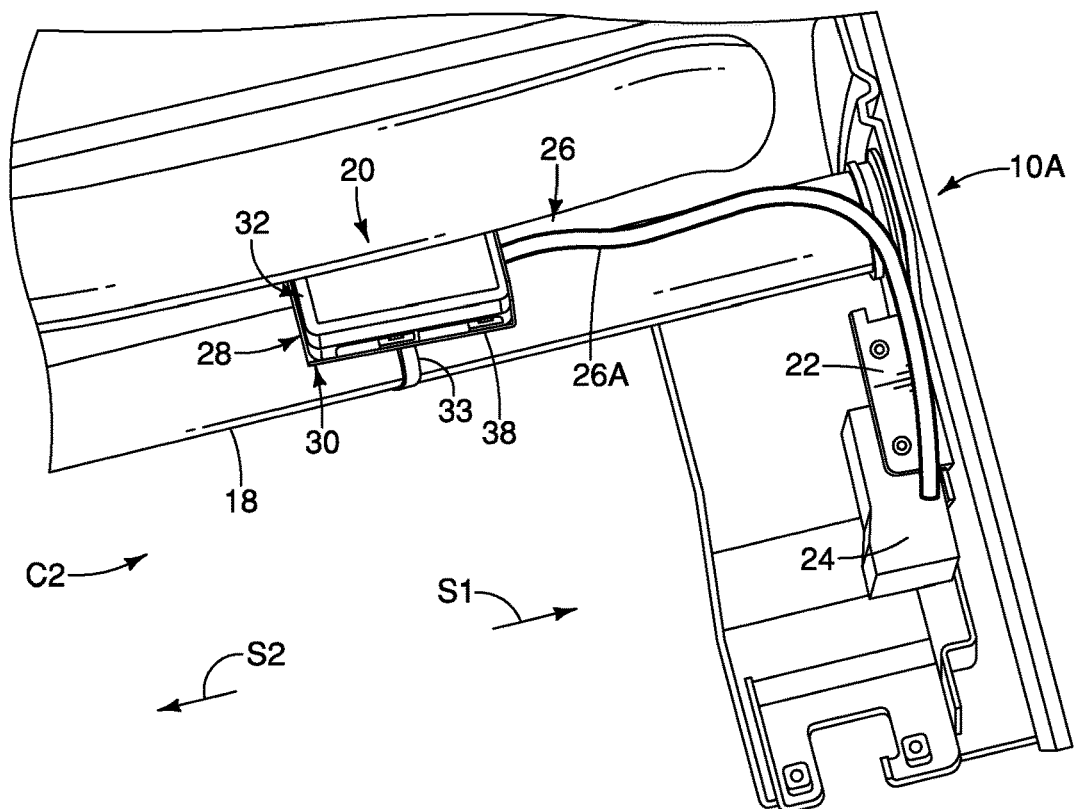
FIG. 3 is another view of the cockpit module equipped with the vehicle tracking unit of FIGS. 1 and 2.

Referring initially to FIGS. 1 to 3, a portion of a vehicle 10 is illustrated having a cockpit module 12 for a passenger compartment of the vehicle 10. The cockpit module 12 separates the passenger compartment into a first area C1 and a second area C2. The first area C1 is located forward of the cockpit module skin 12 and the second area C2 is located rearward of the cockpit module skin 12. The second area C2 defines a vehicle cabin area where the vehicle's 10 passengers sit.

In particular, the cockpit module 12 includes a skin 14 extending laterally from a driver's side S1 to a passenger's side S2 of the vehicle 10. The skin 14 is constructed of any suitable rigid material such as a plastic material (e.g., steel and/or plastic). The skin 14 defines a thin cover or trim of the vehicle's cockpit module 12 that supports the vehicle's 10 electronic instrument cluster or meter, including the vehicle's 10 speedometer and other analog gauges in the second area C2. The skin 14 has reinforced portions, as needed and/or desired. For example, the reinforced portions can be constructed of thicker or higher strength plastic.

The vehicle 10 includes a steering column (not shown) that extends through an opening (not shown) of the skin 14 between the first area C1 and the second area C2. In particular, the vehicle 10 can include a steering frame 16 mounted to the skin 14 that has a channel for the steering column (not shown). The steering column is connected to a steering wheel (not shown) that is supported to the steering frame 16 in the second area C2.

As shown in FIGS. 1 and 2, the vehicle 10 further comprises a cross-bar 18 that is supported behind the skin 14 (e.g., forward of the skin 14) by a portion of a vehicle body component 10A that is part of the vehicle's 10 body (e.g., part of the vehicle's 10 outer body, in particular the sides of the vehicle 10, the underbody of the vehicle 10 and the vehicle's 10 roof). The cross-bar 18 is made of a durable steel tube to support a variety of vehicle components, brackets and equipment that are stored in the first area C1. The cross-bar 18 also helps reinforce the vehicle's 10 chassis (e.g., the base frame of the vehicle). The cross-bar 18 extends laterally across the first area C1 from the vehicle's 10 driver's side S1 to the passenger's side S2.

The cockpit module 12 includes the cross-bar 18. Therefore, the cross-bar 18 can be considered a component of the cockpit module 12. In the illustrated embodiment, as shown in FIGS. 1 to 3, the cross-bar 18 further supports a vehicle tracking unit 20 within the first area C1 of the passenger compartment. Therefore, the vehicle 10 further includes the vehicle tracking unit 20, as will be further described.

As shown in FIGS. 1 to 3, the vehicle 10 further includes a cross member bracket 22 that attaches the cross-bar 18 to the vehicle's body (e.g., the outer structure of the vehicle 10). As best seen in FIG. 2, the vehicle 10 further includes a fuse box 24 (e.g., integrated power module (IPM)) that is supported to the cross member bracket 22 and to the skin 14.

The fuse box 24 houses a plurality of fuses that protect the wiring and electrical equipment for the vehicle 10 inside the first area C1. As shown, the fuse box 24 is located on the driver's side S1 of the first area C1 near the skin 14. In particular, the fuse box 24 is mounted to the cross member bracket 22 towards the driver's side S1. However, it will be apparent to those skilled in the vehicle field from this disclosure that the fuse box 24 can be mounted to other electrical components of the vehicle 10.

Figure 4:
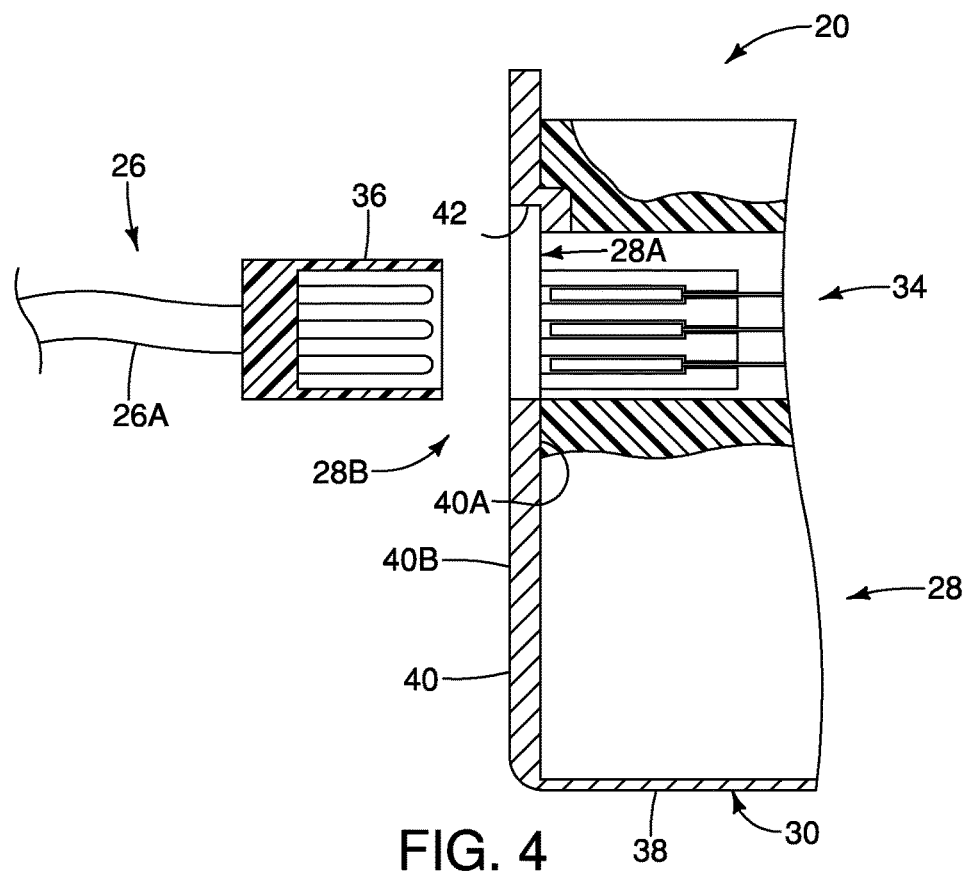
FIG. 4 is a top schematic view of a portion of the vehicle tracking unit and an electrical harness that is to be plugged into the vehicle tracking unit.

In the illustrated embodiment, the vehicle tracking unit 20 is electrically connected to the fuse box 24. In particular, as best seen in FIGS. 3 and 4, the vehicle 10 further comprises an electrical harness 26 having one or more cables (one cable 26A shown for simplicity) connecting the electric tracking module 28 to the fuse box 24 in the first area C1, as will be further discussed below. It will be apparent to those skilled in the vehicle field from this disclosure that the fuse box 24 can alternatively be supported to another cross member bracket that is located on the passenger's side S2 of the first area C1 with the vehicle tracking unit 20 electrically connected to the fuse box 24 that is towards the passenger's side S2.

Figure 5:
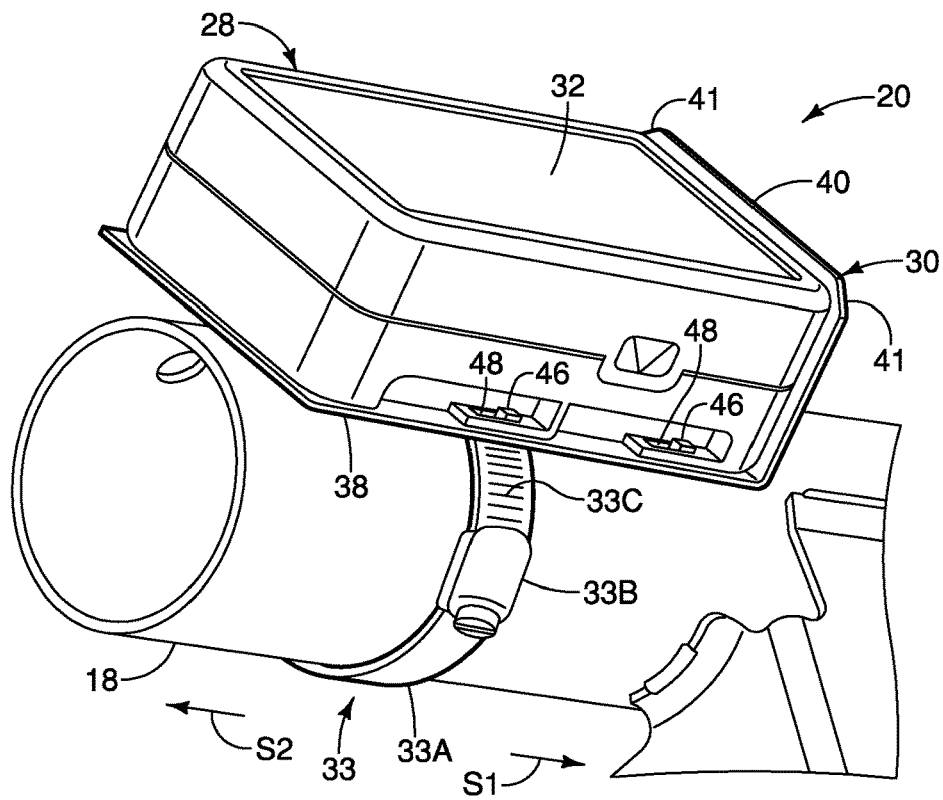
FIG. 5 is a perspective view of the vehicle tracking unit installed to a cross-bar of the vehicle.
Figure 6:
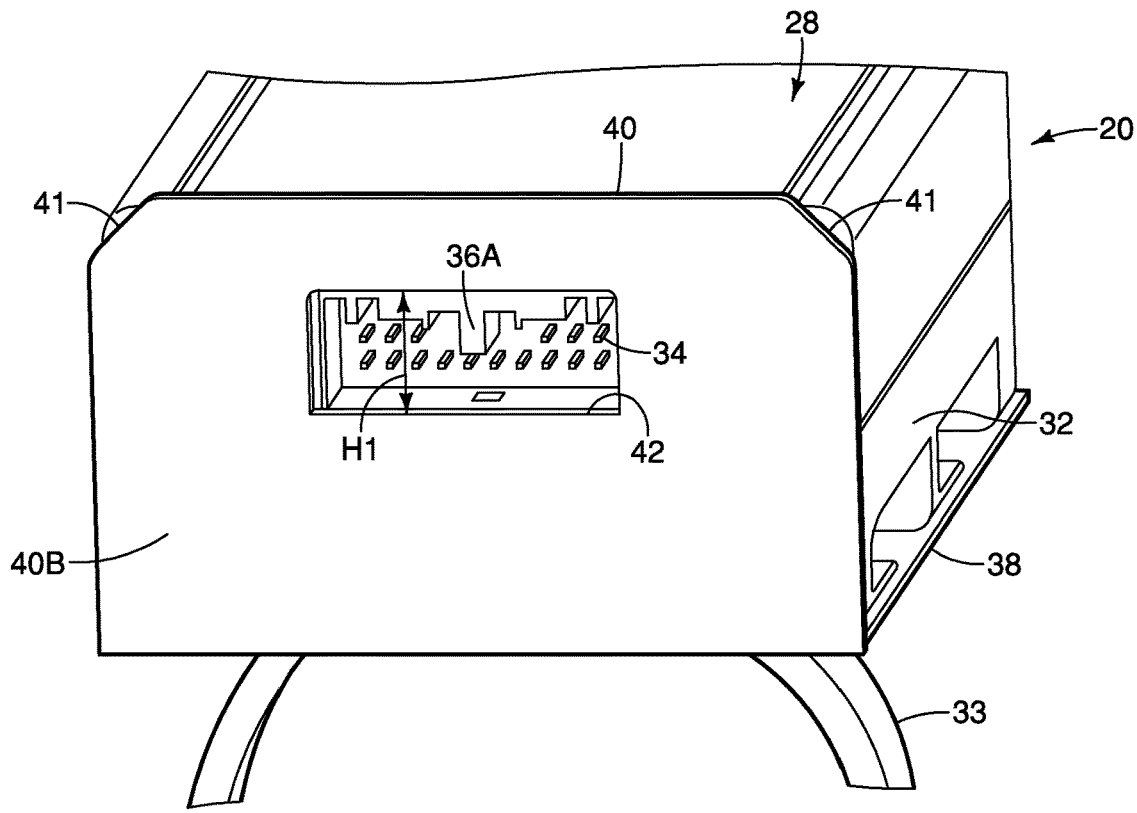
FIG. 6 is a front perspective view of the vehicle tracking unit.
Figure 7:
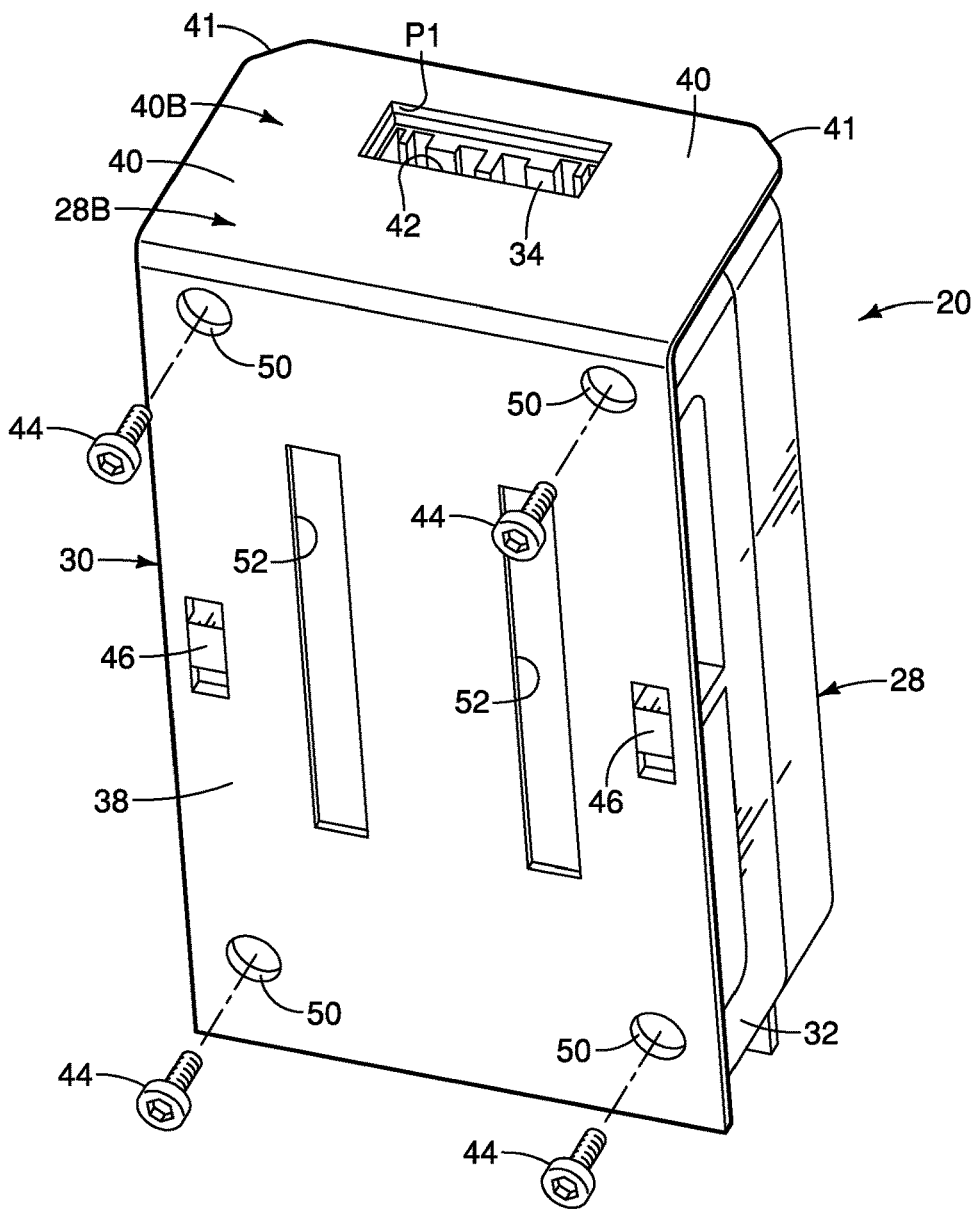
FIG. 7 is a bottom perspective view of the vehicle tracking unit.

Referring to FIGS. 5 to 7, the vehicle tracking unit 20 has an electric tracking module 28 and a mounting bracket 30 that supports the electric tracking module 28 to the cross-bar 18. Therefore, the mounting bracket 30 is fixed to the electric tracking module 28 to support the electric tracking module 28 to the cross-bar 18. In the illustrated embodiment, the vehicle tracking unit 20 is an accessory product for the vehicle 10.

The electric tracking module 28 of the vehicle tracking unit 20 includes a global positioning system (GPS) module that is capable of monitoring the location and movement of the vehicle 10. The electric tracking module 28 can also be programmed to send notifications and/or alerts to the vehicle owner with information regarding the location and the movement of the vehicle 10. The electrical components of the electric tracking module 28 are housed in a housing 32 of the electric tracking module 28. Preferably, the housing 32 of the electric tracking module 28 is a metal housing 32.

Figure 9:
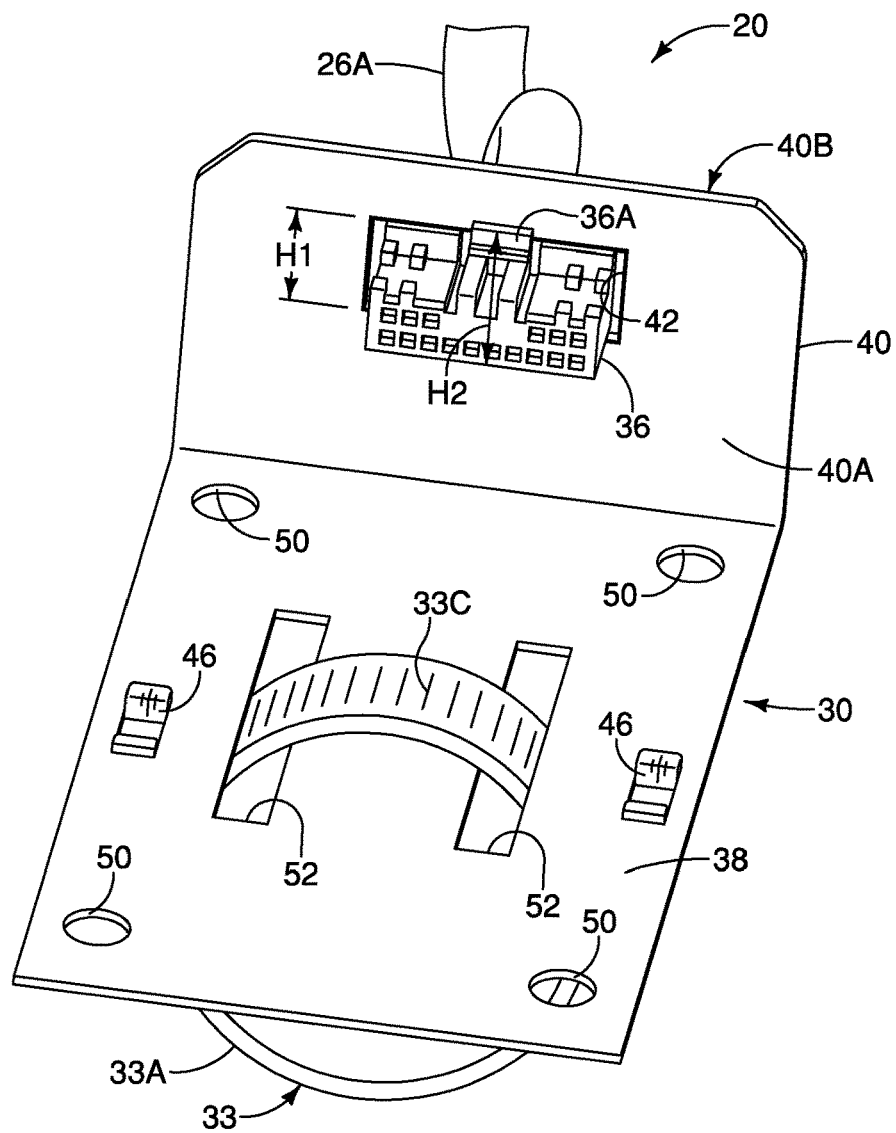
FIG. 9 is a interior perspective view of the mounting bracket having the electrical harness of FIG. 8.

Typically, vehicle tracking units are targeted for removal during vehicle theft so that the vehicle 10 is not tracked. Therefore, the vehicle tracking unit 20 of the illustrated embodiment is provided to be fixedly attached to the cross-bar 18 in the first area C1 to make removal and disabling of the vehicle tracking unit 20 difficult. The vehicle tracking unit 20 is also electronically routed to the fuse box 24 in a manner that will make removable and disabling of the vehicle tracking unit 20 difficult. Therefore, as seen in FIGS. 5, 6 and 9, the vehicle tracking unit 20 further comprises a clamp 33 connecting the mounting bracket 30 to the cross-bar 18. The vehicle tracking unit 20 is clamped to the cross-bar 18 such that it is difficult to remove the vehicle tracking unit 20 from the vehicle 10 using only simple tools such as a screwdriver. The vehicle tracking unit 20 is also preferably positioned along the cross-bar 18 at a location behind the skin 14 and the vehicle's 10 speedometer.

Further, the vehicle tracking unit 20 is fixed to the cross-bar 18 such that the electric tracking module 28 faces away from the second area C2 in a vehicle forward direction D1, as best seen in FIGS. 1 and 2. The vehicle tracking unit 20 is electrically connected by the electrical harness 26 to the fuse box 24 in a direction that is difficult for someone to remove the electrical connection, as will be further discussed below. By improving the retention of the vehicle tracking unit 20 inside the vehicle 10, the time it takes to remove the vehicle tracking unit 20 during a vehicle theft becomes prolonged such that the success rate of theft is reduced.

Referring to FIGS. 4, 6, 8 and 9, the electric tracking module 28 includes a first electrical connector 34. The electrical harness 26 includes a second electrical connector 36 that mates with the first electrical connector 34. The first electrical connector 34 is a female connector and the second electrical connector 36 is a male connector that is plugged into the female connector. The second electrical connector 36 is connected to the cable 26A that is routed and plugged to the fuse box 24 to power the components of the electric tracking module 28.

As best seen in FIGS. 1 to 4 and 8, the first and second electrical connectors 34 and 36 are supported to the electric tracking module 28 at a first side 28A (interior side) of the mounting bracket 30 when the first and second electrical connectors 34 and 36 are mated to each other. The cable 26A extends from the first electrical connector 34 at a second side 28B (exterior side) of the mounting bracket 30 that is opposite of the first side. This arrangement of the first and second electrical connectors 34 and 36 with respect to the mounting bracket 30 helps prevent easy detachment of second electrical connector 36 from the first electrical connector 34. That is, it is difficult to unplug the second electrical connector 36 from the first electrical connector 34 once the electrical harness 26 is plugged into the vehicle tracking unit 20.

Referring to FIGS. 7 to 10, the mounting bracket 30 includes a first panel 38 and a second panel 40 that are preferably made of sheets of metal, such as steel or aluminum. The first and second panels 38 and 40 extend cantilevered with respect to each other. That is, the first and second panels 38 and 40 extend at a right angle with respect to each other. The first and second panels 38 and 40 can be sheets of metal that are welded together such that the first and second panels 38 and 40 form a single integrated unit. The first panel 38 is fixedly attached to the cross-bar 18. The electric tracking module 28 is supported to the first panel 38. The first and second electrical connectors 34 and 36 are supported to the second panel 40. In particular, as seen in FIG. 7, the second panel 40 has a cutout 42. The second electrical connector 36 of the harness extends through the cutout 42 of the second panel 40 to be plugged into the first electrical connector 34.

In the illustrated embodiment, the first panel 38 extends between the electric tracking module 28 and the cross-bar 18, as seen in FIG. 5. Therefore, the electric tracking module 28 is supported to the cross-bar 18 by the first panel 38. As best seen in FIGS. 2 and 3, the first panel 38 faces towards the second area C2 while the electric tracking module 28 faces towards the vehicle forward direction D1 when the vehicle tracking unit 20 is installed to the cross-bar 18. The second panel 40 also faces away from the second area C2 towards the vehicle forward direction D1 when the vehicle tracking unit 20 is installed to the cross-bar 18. In this way, the electrical connection between the first and second electrical connectors 34 and 36 is positioned behind the cross-bar 18 with respect to the second area C2. That is, the electric tracking module 28 is positioned in the first area C1 such that the electric tracking module 28 is difficult to reach. The positioning of the vehicle tracking unit 20 within the first area C1 also makes it such that the cross-bar 18 is blocking access to the vehicle tracking unit 20.

Referring to FIGS. 7 to 10, in the illustrated embodiment, the electric tracking module 28 and the first panel 38 are connected by snap-fit, and also fixedly connected by fasteners 44. In particular, the first panel 38 has a pair of first and second positioning structures 46 (e.g., protrusions). The housing 32 of the electric tracking module 28 includes a pair of corresponding first and second positioning structures 48 (e.g., recesses) that mate with the first and second positioning structures 46 of the first panel 38.

Therefore, the first panel 38 has a positioning structure (e.g., first and second positioning structures 46) that mates with a corresponding positioning structure (e.g., pair of corresponding first and second positioning structures 48) of the electric tracking module 28 so that the first electrical connector 34 of the electric tracking module 28 faces the cutout 42 of the second panel 40 when the electric tracking module 28 is installed to the mounting bracket 30. Thus, the first and second positioning structures 46 and the corresponding first and second positioning structures 48 are provided to correctly orient the electric tracking module 28 with respect to the mounting bracket 30.

Figure 10:
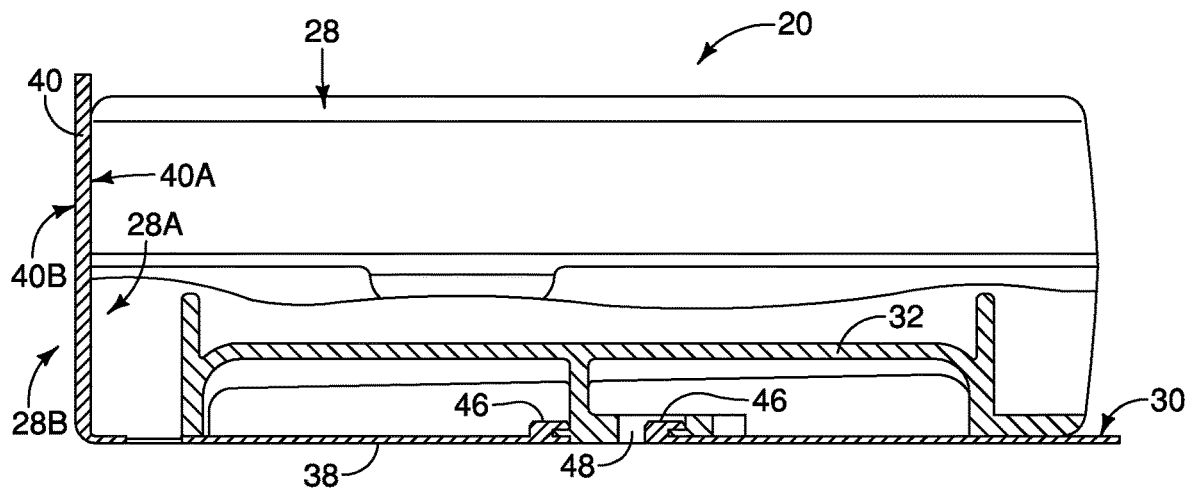
FIG. 10 is a partial cross-sectional view of the vehicle tracking unit.

In the illustrated embodiment, as best seen in FIG. 10, the first and second positioning structures 46 of the first panel 38 and the corresponding first and second positioning structures 48 of the electric tracking module 28 are mated by snap-fit. Therefore, the first panel 38 and the housing 32 of the electric tracking module 28 are connected by snap-fit. In particular, the protrusions of the first and second positioning structures 46 are received by the recesses of the corresponding first and second positioning structures 48.

In the illustrated embodiment, first panel 38 and the housing 32 of the electric tracking module 28 are mated in such a way such that the first electrical connector 34 of the electric tracking module 28 faces the cutout 42 of the second panel 40 towards the driver's side S1. That is, the first and second positioning structures 46 and the corresponding first and second positioning structures 48 are structured such that the first electrical connector 34 faces the cutout 42 of the second panel 40 when the electric tracking module 28 is fixed to the mounting bracket 30. The first and second positioning structures 46 and the corresponding first and second positioning structures 48 are structured to prevent the first electrical connector 34 from facing away from the second panel 40 (towards the passenger's side S2).

It will be apparent to those skilled in the vehicle field from this disclosure that the first and second positioning structures 46 can alternatively be recesses and the corresponding first and second positioning structures 48 can alternatively be protrusions that mate with the recesses. It will also be apparent to those skilled in the vehicle field from this disclosure that the mounting bracket 30 and the housing 32 of the electric tracking module 28 can be positioned with respect to each other using alternative means, such as by positioning pins and the like to ensure that the first electrical connector 34 faces the second panel 40.

Referring to FIG. 7, the vehicle tracking unit 20 further includes a plurality of fasteners 44 that fixedly connect the first panel 38 and the housing 32 of the electric tracking module 28. As best seen in FIG. 9, the first panel 38 includes a plurality of through holes that will align with a plurality of receiving openings (not shown) of the housing 32. In the illustrated embodiment, the fasteners 44 are threaded fasteners 44 that extend through the first panel 38 to engage with threaded of the housing 32.

Therefore, the vehicle tracking unit 20 further comprising at least one fastener 44 extending through the first panel 38 and the housing 32 of the electric tracking module 28 to fix the electric tracking module 28 to the first panel 38. The fasteners 44 can be screws and/or bolts that fasten the mounting bracket 30 to the housing 32. As further seen in FIG. 7, the first panel 38 includes a pair of elongated cutouts (e.g., slots 52) for the clamp 33. The clamp 33 extends through the pair of slots 52 to fix the first panel 38 to the cross-bar 18.

Referring to FIGS. 2, 3, 8 and 9, the cutout 42 of the second panel 40 faces the driver's side S1 of the vehicle 10 when the electric tracking module 28 is supported to the cross-bar 18. Preferably, the second panel has tapered corner areas 41 that are safety features to prevent damage to other components in the first area C1. As the fuse box 24 is supported to the driver's side S1, the electrical harness 26 is routed from the vehicle tracking unit 20 towards the driver's side S1. However, as previously stated, the fuse box 24 can be repositioned to be supported to the passenger's side S2 of the vehicle 10.

Therefore, it will be apparent to those skilled in the vehicle field from this disclosure that the mounting bracket 30 can be reversed so that the mounting bracket 30 and the first and second electrical connectors 34 and 36 are positioned towards the passenger's side S2 so long as the mounting bracket 30 is fixed to the cross-bar 18 such that the electric tracking unit 28 and the first and second electrical connectors 34 and 36 are blocked by the cross-bar 18 from access from the second area C2.

Figure 8:
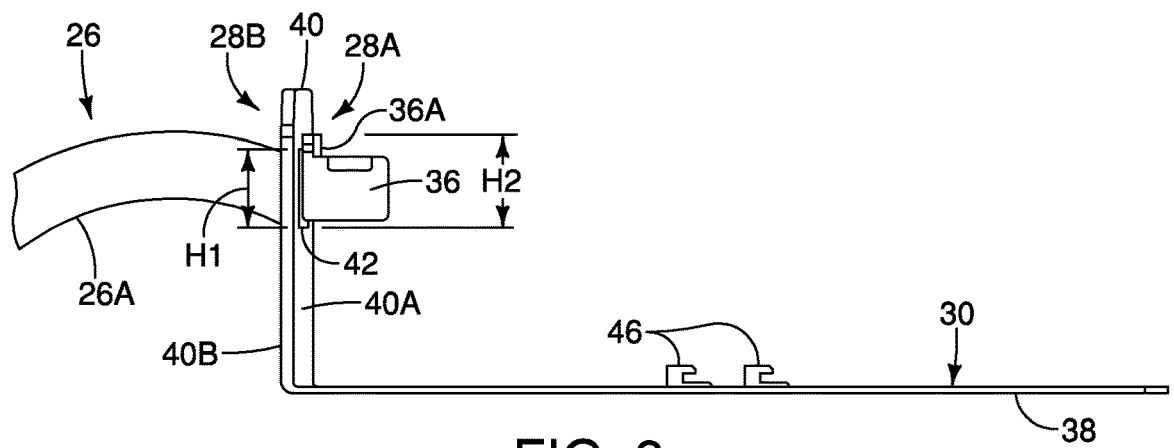
FIG. 8 is a side view of a mounting bracket of the vehicle tracking unit having the electrical harness supported thereon.

As shown in FIGS. 8 and 9, the second electrical connector 36 of the electrical harness 26 is supported at a first side 40A (e.g., interior side) of the second panel 40. The cable 26A of the electrical harness 26 extends through the cutout 42 into a second side 40B (e.g., exterior side) of the second panel 40. The first and second sides 40A and 40B are opposite sides of the second panel 40 with respect to each other. Once the first and second electrical connectors 34 and 36 are plugged and the housing 32 of the electric tracking unit 28 is installed to the mounting bracket 30, the first and second electrical connectors 34 and 36 cannot be unplugged without the dismantling the housing 32 from the mounting bracket 30.

As best seen in FIGS. 8 and 9, the cutout 42 has a maximum height H1 that is smaller than a maximum height H2 of the second electrical connector 36 of the electrical harness 26. In this way, once the second electrical harness 26 is plugged into the electric tracking module 28, the second electrical harness 26 cannot be unplugged because the cutout 42 of the second panel 40 will be too small to unplug the second electrical harness 26 from the second side 40B of the second panel 40. In particular, as seen in FIG. 9, the second electrical connector 36 includes a lever connector such that a lever 36A abuts the second panel 40 against the first side 40A of the second panel 40.

The vehicle tracking unit 20 further comprises the clamp 33 that installs the first panel 38 to the cross-bar 18. In the illustrated embodiment, the clamp 33 is preferably a worm gear hose clamp. The clamp 33 can be made from zinc-plated steel or various grades of stainless steel. As best seen in FIG. 5, the clamp 33 includes a slitted band 33A, a screw housing 33B and a worm gear or helical-threaded screw (not shown) that engages slits 33C in the slitted band 33A. As best seen in FIG. 9, the clamp 33 is strapped through the slits 33C of the first panel 38 and then clamped to the exterior of the cross-bar 18.

During installation vehicle tracking unit 20 into the vehicle 10, the second electrical connector 36 of the electrical harness 26 is plugged into the first electrical connector 34 of the electric tracking module 28. The housing 32 of the electric tracking module 28 is snap-fitted to the first panel 38 of the mounting bracket 30 to correctly orient the electric tracking module 28 with respect to the mounting bracket 30. The cable 26A of the electrical harness 26 is routed through the cutout 42 of the second panel 40 as the housing 32 is snapped to the mounting bracket 30. The fasteners 44 are then installed through the first panel 38 and the housing 32 of the electric tracking module 28 to fixedly connect the electric tracking module 28 to the mounting bracket 30. The clamp 33 installs the vehicle tracking unit 20 to the cross-bar 18 and is then tightened. The clamp 33 enables the electric tracking module 28 to be oriented away from the second area C2. The cable 26A of the electrical harness 26 is then routed to the fuse box 24 to electrically connect the electric tracking module 28 to the fuse box 24.

General Interpretation of Terms

In understanding the scope of the present invention, the term "comprising" and its derivatives, as used herein, are intended to be open ended terms that specify the presence of the stated features, elements, components, groups, integers, and/or steps, but do not exclude the presence of other unstated features, elements, components, groups, integers and/or steps. The foregoing also applies to words having similar meanings such as the terms, "including", "having" and their derivatives. Also, the terms "part," "section," "portion," "member" or "element" when used in the singular can have the dual meaning of a single part or a plurality of parts. Also as used herein to describe the above embodiment(s), the following directional terms "forward", "rearward", "above", "downward", "vertical", "horizontal", "below" and "transverse" as well as any other similar directional terms refer to those directions of a vehicle equipped with the vehicle tracking unit. Accordingly, these terms, as utilized to describe the present invention should be interpreted relative to a vehicle equipped with the vehicle tracking unit.

The term "configured" as used herein to describe a component, section or part of a device includes hardware and/or software that is constructed and/or programmed to carry out the desired function.

The terms of degree such as "substantially", "about" and "approximately" as used herein mean a reasonable amount of deviation of the modified term such that the end result is not significantly changed.

While only selected embodiments have been chosen to illustrate the present invention, it will be apparent to those skilled in the art from this disclosure that various changes and modifications can be made herein without departing from the scope of the invention as defined in the appended claims. For example, the size, shape, location or orientation of the various components can be changed as needed and/or desired. Components that are shown directly connected or contacting each other can have intermediate structures disposed between them. The functions of one element can be performed by two, and vice versa. The structures and functions of one embodiment can be adopted in another embodiment. It is not necessary for all advantages to be present in a particular embodiment at the same time. Every feature which is unique from the prior art, alone or in combination with other features, also should be considered a separate description of further inventions by the applicant, including the structural and/or functional concepts embodied by such feature(s). Thus, the foregoing descriptions of the embodiments according to the present invention are provided for illustration only, and not for the purpose of limiting the invention as defined by the appended claims and their equivalents.

What is claimed is:

1. A vehicle comprising:
a cockpit module skin separating a passenger compartment of the vehicle into a first area that is forward of the cockpit module skin and a second area that is rearward of the cockpit module skin, the second area having a steering wheel frame that is supported with respect to the cockpit module skin;
a cross-bar supported to a vehicle body component in the first area such that the cross-bar and the steering wheel frame are positioned on opposite sides of the cockpit module skin; and
a vehicle tracking unit having an electric tracking module and a mounting bracket supporting the electric tracking module to the cross-bar, the vehicle tracking unit being directly mounted to a vehicle forward side of the cross-bar.

2. The vehicle according to claim 1, further comprising an electrical harness having a cable connecting the electric tracking module to a fuse box of the vehicle.

3. The vehicle according to claim 2, wherein
the electric tracking module includes a first electrical connector and the electrical harness includes a second electrical connector that mates with the first electrical connector,
the first and second electrical connectors are supported to the electric tracking module at a first side of the mounting bracket, the cable extending from the first electrical connector at a second side of the mounting bracket that is opposite of the first side.

4. The vehicle according to claim 3, wherein
the mounting bracket includes a first panel and a second panel, the first and second panels extending cantilevered with respect to each other.

5. The vehicle according to claim 4, wherein
the first panel extends between the electric tracking module and the cross-bar.

6. The vehicle according to claim 5, wherein
the second panel includes a cutout, the cutout facing a driver's side direction of the vehicle.

7. The vehicle according to claim 6, wherein
the second electrical connector of the electrical harness is supported at the first side that is a first side of the second panel, the cable of the electrical harness extending through the cutout into the second side that is a second side of the second panel.

8. The vehicle according to claim 7, wherein
the cutout has an outer perimeter that is smaller than an outer perimeter of the second electrical connector.

9. The vehicle according to claim 5, further comprising a clamp connecting the first panel to the cross-bar.

10. The vehicle according to claim 7, wherein
the first panel has a positioning structure that mates with a corresponding positioning structure of the electric tracking module so that the first electrical connector of the electric tracking module faces the cutout of the second panel.

11. A vehicle tracking unit, comprising:
an electric tracking module; and
a mounting bracket fixed to the electric tracking module to support the electric tracking module to a vehicle body component, the mounting bracket including a first panel and a second panel, the first and second panels extending cantilevered with respect to each other; and
a clamp connecting the first panel to a cross-bar of the vehicle, the second panel including a cutout, the cutout facing a driver's side direction of the vehicle when the electric tracking module is supported to the vehicle body component.

12. The vehicle tracking unit according to claim 11, wherein
the electric tracking module includes a first electrical connector, the first electrical connector facing the cutout of the second panel.

13. The vehicle tracking unit according to claim 12, wherein
the first panel having a positioning structure that mates with a corresponding positioning structure of the electric tracking module so that the first electrical connector of the electric tracking module faces the cutout of the second panel.

14. The vehicle tracking unit according to claim 13, wherein
the positioning structure of the first panel and the corresponding positioning structure of the electric tracking module are mated by snap-fit.

15. The vehicle tracking unit according to claim 14, further comprising
at least one fastener extending through the first panel and a housing of the electric tracking module to fix the electric tracking module to the first panel.

16. The vehicle tracking unit according to claim 15, wherein
the first panel includes a pair of cutouts, the clamp extending through the pair of cutouts.

\* \* \* \* \*